United States Patent
Royhob

(10) Patent No.: US 9,063,623 B2
(45) Date of Patent: Jun. 23, 2015

(54) CAPACITIVE TOUCH SENSOR ASSEMBLY FOR USE IN A WET ENVIRONMENT

(71) Applicant: Sam Royhob, Orange, CA (US)

(72) Inventor: Sam Royhob, Orange, CA (US)

(73) Assignee: Green Cedar Holdings LLC, Orange, CA (US)

( * ) Notice: Subject to any disclaimer, the term of this patent is extended or adjusted under 35 U.S.C. 154(b) by 225 days.

(21) Appl. No.: 13/671,412

(22) Filed: Nov. 7, 2012

(65) Prior Publication Data

US 2013/0141387 A1    Jun. 6, 2013

Related U.S. Application Data

(60) Provisional application No. 61/565,945, filed on Dec. 1, 2011.

(51) Int. Cl.
*G06F 3/044* (2006.01)
*H03K 17/96* (2006.01)

(52) U.S. Cl.
CPC ............ *G06F 3/044* (2013.01); *H03K 17/9622* (2013.01); *H03K 2217/960715* (2013.01)

(58) Field of Classification Search
CPC ... H03K 17/975; H03K 17/96; H03K 17/965; H03K 17/955
USPC .......... 200/600; 324/519, 658, 660–662, 686
See application file for complete search history.

(56) References Cited

U.S. PATENT DOCUMENTS

| | | | |
|---|---|---|---|
| 4,046,975 A * | 9/1977 | Seeger, Jr. ..................... 200/5 A |
| 4,304,976 A | 12/1981 | Gottbreht et al. | |
| 4,377,049 A | 3/1983 | Simon et al. | |
| 4,413,252 A | 11/1983 | Tyler et al. | |
| 4,561,002 A | 12/1985 | Chiu | |
| 4,875,497 A | 10/1989 | Worthington | |
| 5,012,124 A | 4/1991 | Hollaway | |
| D363,060 S | 10/1995 | Hunger et al. | |
| 5,883,459 A | 3/1999 | Cline et al. | |
| 5,917,165 A * | 6/1999 | Platt et al. ..................... 200/600 |
| 6,016,020 A | 1/2000 | Cline et al. | |
| 6,373,265 B1 | 4/2002 | Morimoto et al. | |
| 6,667,563 B2 | 12/2003 | Bae et al. | |
| 7,084,933 B2 | 8/2006 | Oh et al. | |
| 7,232,973 B2 | 6/2007 | Kaps et al. | |
| 7,511,242 B2 | 3/2009 | Winkler | |
| 7,525,062 B2 | 4/2009 | Adam et al. | |
| 7,579,569 B2 | 8/2009 | Romanowski | |
| 7,652,220 B2 | 1/2010 | Weiss | |
| 7,741,858 B2 | 6/2010 | Jeong | |
| 7,821,274 B2 | 10/2010 | Philipp et al. | |

(Continued)

*Primary Examiner* — Amy Cohen Johnson
*Assistant Examiner* — Marina Fishman
(74) *Attorney, Agent, or Firm* — Matthew K. Hillman

(57) ABSTRACT

A controller for use in a wet environment, such as a controller for a pool or spa, includes a sensor element that generates an electric field having an active region. For the controller, at least one flexible layer is positioned to overlay the sensor element and surround the active region. With this arrangement, a pocket is established between the flexible layer and sensor element. A control circuit that is responsive to the capacitance between the sensor element and the flexible layer is provided. When the flexible layer is deformed, the capacitance changes and the control circuit generates an output signal that corresponds to a particular switch state for a connected device (e.g. pump or heater). For the controller, the control circuit is designed and/or calibrated to maintain a current switch state output in response to the presence of water on the controller and near the active region.

7 Claims, 4 Drawing Sheets

(56) References Cited

U.S. PATENT DOCUMENTS

| | | |
|---|---|---|
| 7,834,287 B2 | 11/2010 | Heiman et al. |
| 2005/0045621 A1 | 3/2005 | Chenier et al. |
| 2005/0076302 A1 | 4/2005 | Okamoto |
| 2006/0243575 A1 | 11/2006 | Cenedese |
| 2007/0101489 A1 | 5/2007 | Hutchings |
| 2008/0231605 A1 | 9/2008 | Yang |
| 2008/0273016 A1 | 11/2008 | Helgesen |
| 2009/0027356 A1 | 1/2009 | Heimann et al. |
| 2009/0058818 A1 | 3/2009 | Chang et al. |
| 2009/0085892 A1 | 4/2009 | Ishikura et al. |
| 2009/0125736 A1 | 5/2009 | Woo |
| 2009/0135157 A1 | 5/2009 | Harley |
| 2009/0153502 A1 | 6/2009 | Jiang et al. |
| 2009/0278714 A1 | 11/2009 | Lin |
| 2010/0078304 A1 | 4/2010 | Kaps et al. |
| 2010/0102830 A1 | 4/2010 | Curtis et al. |
| 2010/0147602 A1 | 6/2010 | Jung et al. |
| 2010/0181181 A1 | 7/2010 | Hamm |
| 2010/0276268 A1 | 11/2010 | Reinker |
| 2010/0294641 A1 | 11/2010 | Kunkel |
| 2011/0004994 A1 | 1/2011 | Le et al. |
| 2011/0032193 A1 | 2/2011 | Szalkowski |
| 2011/0090173 A1 | 4/2011 | Huang et al. |
| 2011/0109590 A1 | 5/2011 | Park |

* cited by examiner

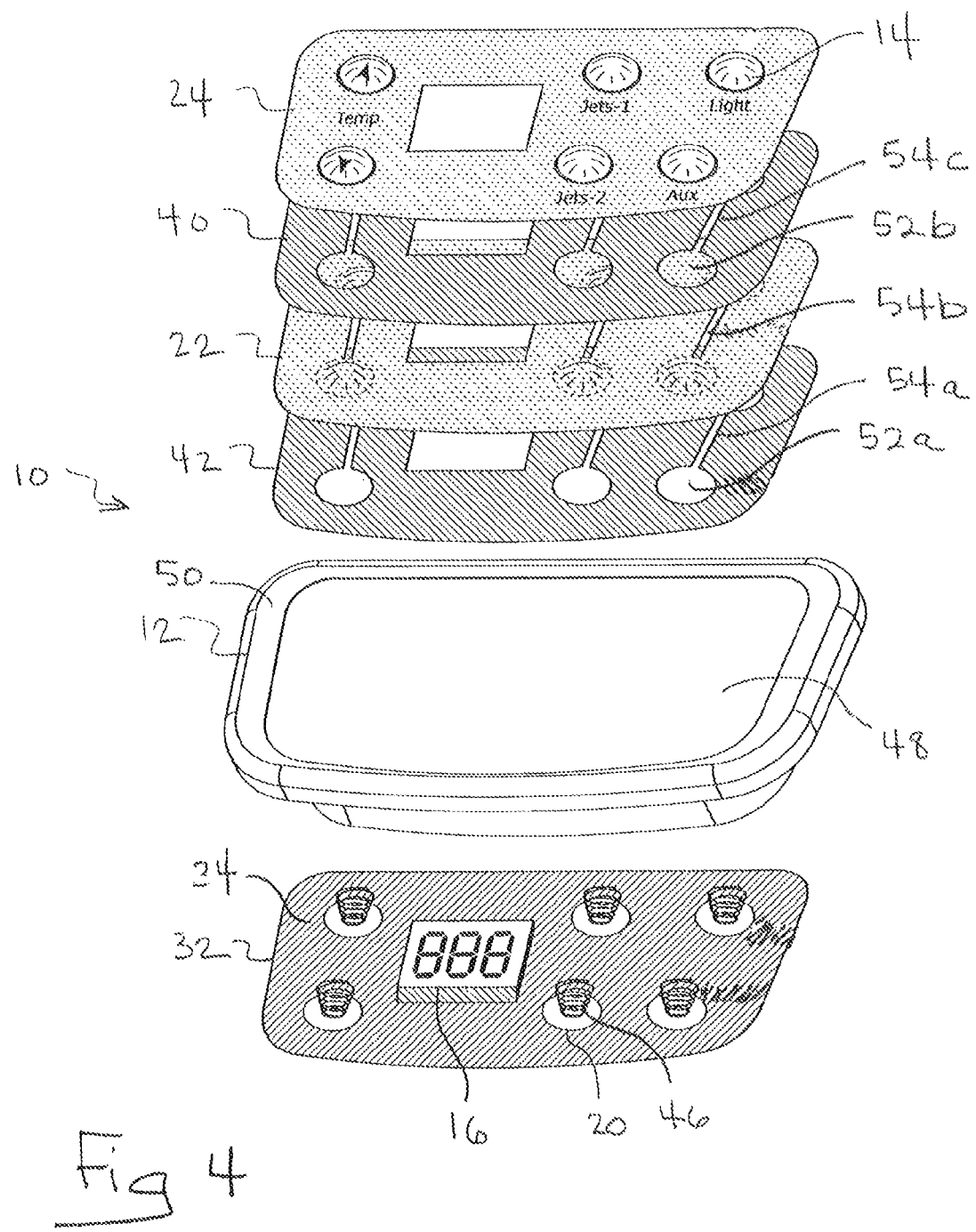

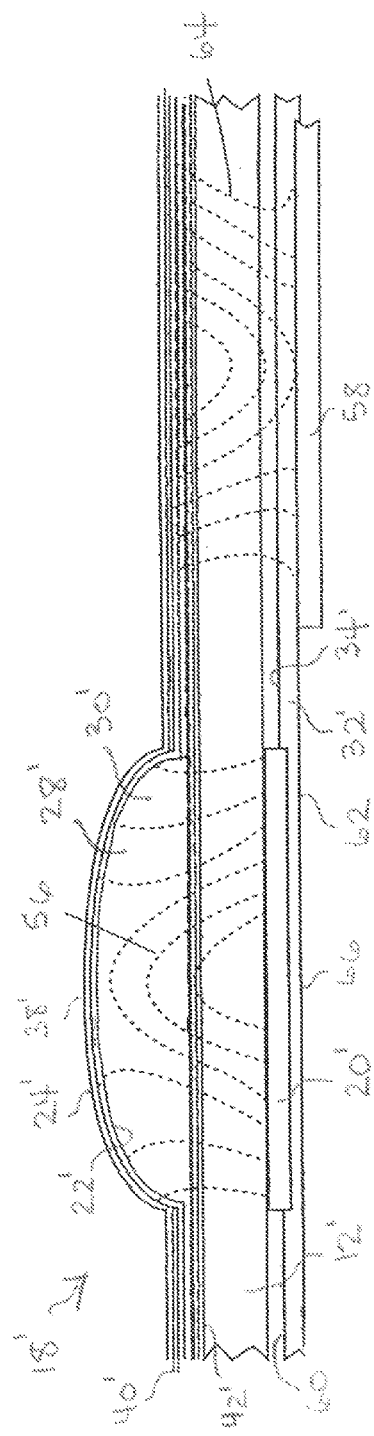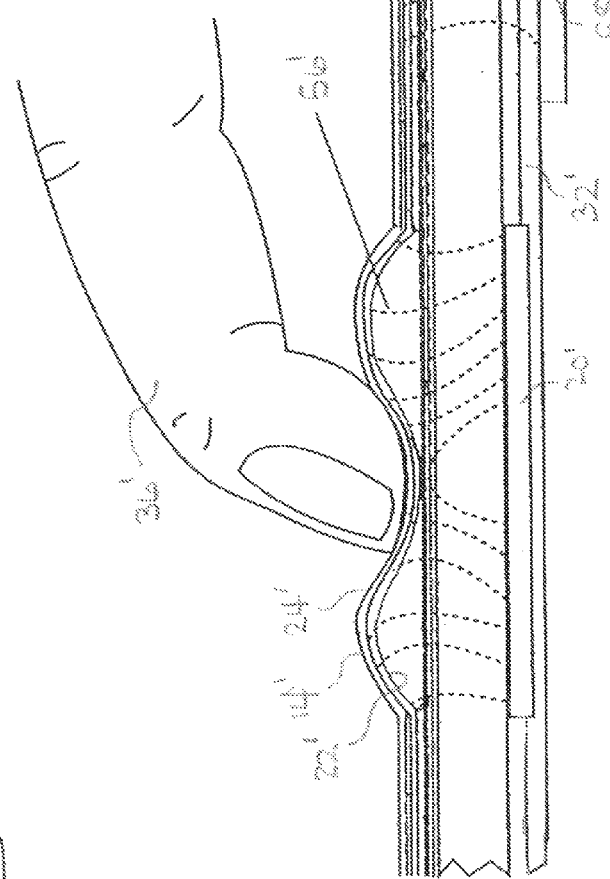

CAPACITIVE TOUCH SENSOR ASSEMBLY FOR USE IN A WET ENVIRONMENT

This application claims the benefit of U.S. Provisional Patent Application Ser. No. 61/565,946, titled "Capacitive Touch Sensor Assembly For Use In A Wet Environment," filed Dec. 1, 2011. The entire contents of Application Ser. No. 61/565,945 are hereby incorporated by reference herein.

FIELD OF THE INVENTION

The present invention pertains generally to user input controllers. More particularly, the present invention pertains to user input controllers for use in a harsh and/or wet environment. The present invention is particularly, but not exclusively, useful as a user input controller having capacitive switches that are suitable for use in harsh and/or wet environments.

BACKGROUND OF THE INVENTION

The typical style of switches used in harsh environments (such as in pools, spas, saunas, boats, industrial equipment, etc.) have heretofore included so-called membrane switches. In harsh environments, these membrane switches are often prone to degradation over time leading to product failure. Alternative switching systems often contain moving parts that tend to breakdown over time leading to product failure. Electronic capacitive sensors, on the other hand, are durable and can be used in place of mechanical and membrane switches as user input controllers. During use, capacitive sensors generate an electric field and define an active region in the electric field. The capacitive sensor then detects and switches state when certain objects, such as a person's finger, have entered the active region. Examples of capacitive sensors include touchscreen technology and capacitive sensors that are implemented as copper traces on standard printed circuit boards. In use, the operator places their finger (which is conductive) in the active region of a capacitive sensor causing a change in capacitance that is sensed by a control circuit. The control circuit than outputs a specific control signal in response to the sensed capacitance change which then causes a device such as a pump or heater to start or stop.

Pools, spas (sometimes referred to as hot tubs) and saunas are examples of wet environments in which user input controllers may be employed. Other wet environments in which user input controllers are employed include marine environments and environments where some types of industrial equipment are employed. In the case of hot tubs and saunas, the controllers are often placed within reach of the person that is using the hot tub/sauna. For example, a controller/control panel may be mounted in a cutout formed in the acrylic shell of a hot tub. In this situation, water can easily enter the active region of a capacitive sensor by splashing, condensation and/or transfer from the user, e.g. transfer from a wet user's hand.

There are at least two problems that can occur when capacitive sensors are used in a user input controller in a wet/harsh environment. First, water in the environment can cause a capacitive sensor to register false sensor readings (i.e. change states). This can happen when water, e.g. droplets, which is conductive, inadvertently enters the active region of the capacitive sensor. To overcome the problem associated with water entering the active region, the sensor can be calibrated to read a more precise range of capacitance change as an actual button press. However, this calibration to a more precise range of capacitance can generate a second undesirable consequence that often needs to be addressed. In more specific terms, once the capacitive sensor is calibrated to avoid false positives due to moisture, the highly calibrated sensors are often so sensitive that some people will have difficulty in triggering the switch. This can occur because every person has a different size, shape, conductance, and ultimately a different capacitance. Unfortunately, the capacitance generated by some people will be outside the calibrated range. These people will be unable to trigger such highly calibrated switches. This phenomenon is compounded in a wet environment because the capacitance measured can be affected when the user is wet.

In light of the above, it is an object of the present invention to provide a capacitive touch sensor assembly for use in a user input controller that can be used in wet and harsh environments without registering false sensor readings when water or other contaminants contact the assembly. Still another object of the present invention is to provide a capacitive touch sensor assembly that can be calibrated to avoid registering false sensor readings when water or other contaminants contact the assembly while allowing all users, regardless of their size, shape or conductance to operate the sensor assembly. Yet another object of the present invention is to provide a capacitive touch sensor assembly for use in a wet environment and corresponding methods of use which are easy to use, relatively simple to implement, and comparatively cost effective.

SUMMARY OF THE INVENTION

In accordance with the present invention, a controller for use in a wet environment, such as a controller for a pool or spa, includes a sensor element that generates an electric field having an active region. For the controller, at least one flexible layer is positioned to overlay the sensor element and surround the active region. With this arrangement, a pocket is established between the flexible layer and sensor element. This pocket, in turn, can include a compressible medium, such as air, to allow the flexible layer over the sensor element to be depressed by a user to turn a device, such as a pump or heater, on or off.

Typically, the controller includes a control circuit that is responsive to the capacitance in the pocket between the sensor element and the flexible layer. Depending on this capacitance, the control circuit generates an output signal that corresponds to a particular switch state for a connected device (e.g. pump or heater). Typically, the output of the control circuit is a signal having a voltage within a first voltage range for a first switch state and a signal having a voltage within a second voltage range for a second switch state. For the controller, the control circuit is designed and/or calibrated to change a switch state output when the flexible layer is deformed and to maintain a current switch state output in response to the presence of water or other contaminants on the controller and near the active region.

In one implementation of the controller, the control circuit can be part of a printed circuit board and can include a processor or other logic elements. The sensor element can be in the form of an electrode that is formed on the surface of the printed circuit board. With this arrangement, the electrode can be electrically connected via a copper trace in the circuit board to the control circuit.

In one embodiment, the flexible layer can be made of plastic (i.e. made of a non-conductive material). In this case, when a person's finger, which is conductive and at a ground state, depresses the flexible layer, the control circuit will detect a change in capacitance between the sensor element and ground. Upon sensing the change in capacitance, the control circuit can produce an appropriate output signal that corresponds to a particular switch state for a connected device.

In another embodiment, a conductive flexible layer, for example made of metal or graphite, is positioned to overlay the sensor element and surround the active region. For this embodiment, the conductive flexible layer is capacitively coupled to a ground pad. For example, the circuit board can include a first circuit board side and an opposed second circuit board side, with the sensor element formed on the first circuit board side and the ground pad overlying at least a portion of the second circuit board side. With this setup, a first capacitor will be established between the sensor element and conductive flexible layer and a second capacitor will be established between the conductive flexible layer and ground pad. Typically, to avoid a nuisance capacitance between the ground pad and sensor element, the location on the second circuit board side that is diametrically opposite the sensor element is not covered by the ground pad.

For either of the embodiments described above, the pocket formed between the sensor element and flexible layer can be connected in fluid communication with an empty passageway. The passageway, in turn, can be connected in fluid communication with one or more other pockets. With this arrangement, the volume of compressible medium that is compressed during a deformation of the flexible layer is increased, and, as a consequence, less force is required to depress the flexible layer and activate the switch.

For either of the embodiments described above, multiple, similarly contoured (e.g. conformal), flexible layers may be juxtaposed and used together to overlay the sensor element and surround the active region. For example, one layer may be conductive and/or have good shape retention characteristics and the other layer may be an exterior overlay that contains printed material for viewing by the user. Typically, each flexible layer has a first side nearest the sensor element and an opposed second side and at least a portion of the second side is concave.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 4 is an exploded view of the controller shown in FIG. 1 showing the components of a multi-button controller having an LED readout;

FIG. 5 is a cross sectional view of an alternative embodiment of a capacitive sensor assembly for the controller shown in FIG. 1, as would be seen along line 2-2 in FIG. 1;

FIG. 6 is a cross sectional view of the capacitive sensor assembly shown as in FIG. 5, shown after the flexible layer has been depressed by a person's finger to activate the switch.

DESCRIPTION OF THE PREFERRED EMBODIMENTS

Figure 1:
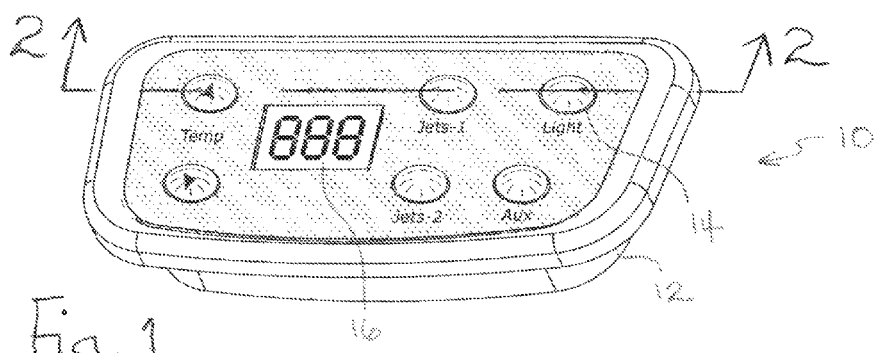
FIG. 1 is a perspective view of a controller for use in a wet environment.

With initial reference to FIG. 1, a controller for use in a wet environment is shown and generally designated 10. For example, the controller may be used to control devices associated with a pool, spa, hot tub, boat or industrial equipment that is located in an environment in which water is present. As shown, the controller 10 can include a sealed plastic enclosure 12, a plurality of sensor buttons 14 and an LED readout 16. In use, the controller is connected to one or more devices, such as a pumps, a heater and/or lights (not shown), for example, using one or more cables (not shown). Another cable (not shown) can be used to connect the controller 10 to a power supply or outlet (not shown). With this arrangement, the sensor buttons 14 can be depressed by a user to turn a device such as a pump, light or heater. On or Off, or to adjust the speed of a device, for example, pump speed or establish a set point, such as water temperature, using the LED readout 16.

Figure 2:
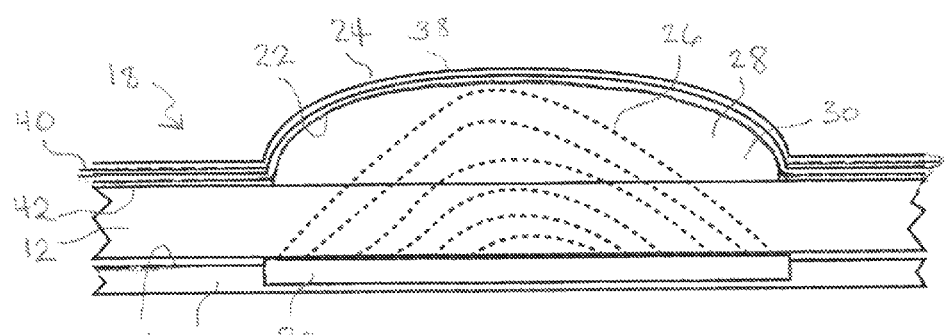
FIG. 2 is a cross sectional view of a capacitive sensor assembly for use in the controller shown in FIG. 1, as seen along line 2-2 in FIG. 1.
Figure 3:
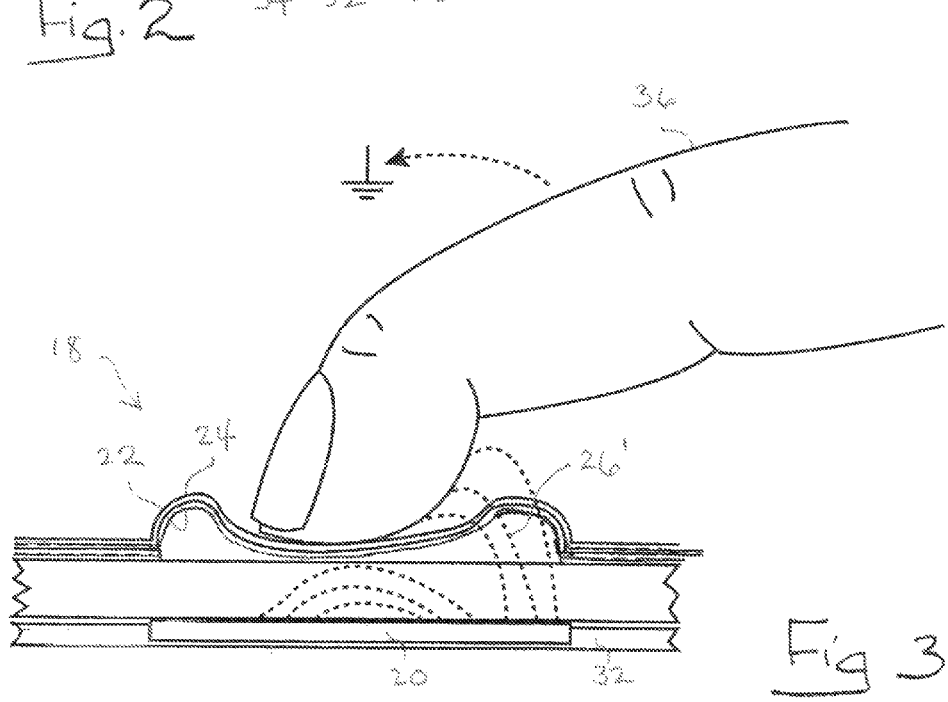
FIG. 3 is a cross sectional view of the capacitive sensor assembly shown as in FIG. 2 shown after the sensor button has been depressed by a person's finger.

FIGS. 2-4 illustrate a first embodiment of a capacitive sensor assembly 18 for the controller 10 shown in FIG. 1. With initial cross reference to FIGS. 1 and 2, it can be seen that the controller 10 includes a sensor button 14 having a sensor element 20 and flexible layers 22, 24. As shown, the sensor element 20 generates an electric field (field lines 26 illustrated by dashed lines) having an active region 28. As shown, the flexible layers 22, 24 are positioned to overlay the sensor element 20 and surround the active region 28. With this arrangement, a pocket 30 is established between the flexible layer 22 and sensor element 20. This pocket 30, in turn, can include a compressible medium, such as air, to allow the flexible layers 22, 24 over the sensor element 20 to be depressed by a user to turn a device not shown) on or off, such as a pump or heater.

As further shown in FIG. 2, the capacitive sensor element 20 can be formed as part of a printed circuit board 32 and can be charged by a power source (not shown) to establish the electric field (field lines 26), the strength of which dissipates with distance from the sensor element 20. For example, as shown, the capacitive sensor element 20 may include an electrode formed in or on the surface 34 of the printed circuit board 32. The electrode can then be electrically connected via a copper trace (not shown) in the circuit board 32 to an electronic control circuit (not shown) that is configured to output voltages corresponding to a switch state such as an 'open' switch state and a 'closed' switch state for the capacitive sensor assembly 18. The output voltages may then be used to activate/deactivate devices (not shown) such as pumps, heaters, etc.

Cross referencing FIGS. 2 and 3, it can be seen that the capacitive sensor assembly 18 establishes an active region 28 within which the presence of a conductive object such as a finger 36 is sensed and changes the output state of the capacitive sensor assembly 18. More specifically, the controller 10 can include a control circuit (not shown), for example having a processor or other electronic logic elements, that is responsive to the capacitance in the pocket 30 between the sensor element 20 and the flexible layer 22. Depending on this capacitance, the control circuit generates an output signal that corresponds to a particular switch state for a connected device (not shown), such as a pump or heater. Typically, the output of the control circuit is a signal having a voltage within a first voltage range for a first switch state and a signal having a voltage within a second voltage range for a second switch state. For the controller 10, the control circuit is designed and/or calibrated to change a switch state output when the flexible layer 22 is deformed and to maintain a current switch state output, in response to the presence of water or other contaminants on the external surface 38 of layer 24.

For the embodiment shown in FIGS. 2-4, the flexible layers 22, 24 can be made of a non-conductive material, such as plastic. In this case, when a person's finger 36, which is conductive and at a ground state, depresses the flexible layers 22, 24, the control circuit will detect a change in capacitance between the sensor element 20 and ground. Upon sensing the change in capacitance, the control circuit can produce an appropriate output signal that corresponds to a particular switch state for a connected device (not shown).

FIG. 2 further shows that the layer 24 may be bonded via adhesive layer 40 to layer 22 which is in turn bonded via adhesive layer 42 to an external surface of the control enclosure 12, which is typically made of clear plastic, to surround the active region 28 of the capacitive sensor element 20. The capacitive sensor element 20 and printed circuit board 32 may be disposed within the enclosure 12, as best appreciated by cross referencing FIGS. 1 and 2. With this arrangement, water droplets from splashing or condensation are unable to inadvertently enter the active region 28 of the capacitive sensor assembly 18 and register a false positive. For the embodiment shown in FIG. 2, the layers 22, 24 may be shaped to present a concave surface 38 to the user. With this concave shape, water droplets may roll off of the layer 24 to prevent water from accumulating to a size sufficient to trigger a false positive. The layer 24 may be made of a flexible plastic material such as Lexan which is a trademarked brand of polycarbonate thermoplastic available from SABIC Innovative Plastics' (formerly General Electric Plastics). Labeling may be provided on the flexible plastic material to indicate sensor function as shown in FIG. 1. The layer 22 may be made of a clear flexible plastic material such as thermoplastic polyester or some other material having good shape memory to maintain shape after repeated cycling. In some cases, a single layer of material (not shown) may be used in place of the layer 22, 24 combination. The sensor element 20 and control circuit may be designed and/or calibrated such that objects such as water droplets outside the layer 24 do not inadvertently trigger the capacitive sensor switch assembly 18.

FIG. 3 shows the sensor switch assembly 18 after the sensor button 14 has been pressed by finger 36. As shown, the layers 22, 24 deform to allow the finger 36 to enter the active region 28 (FIG. 2) of the sensor element 20 and change the electric field (as indicated by the electric field lines 26'). The change in electric field is registered by the electronic control circuit, which in turn changes the sensor switch state and corresponding output voltage. Upon removal of the finger 36, the assembly 18 returns to the configuration shown in FIG. 2.

The sensor switch assembly 18 may be programmed to change states when pressed and hold the changed state when the finger is removed, may be programmed to change states when pressed and revert to the original state when the finger is removed, or may be programmed to change states continuously when pressed and held for a determined length of time until the finger is removed. The later configuration may be used, for example, in conjunction with an LCD readout 16 (or LED readout) or to change a parameter such as temperature to a desired set point.

FIG. 4 shows an exploded view of the controller 10, shown with optional sensor element extenders 46. As shown, the controller includes a printed circuit board 32 (PCB) having an LED or LCD readout 16 and a plurality of capacitive sensors element 20. Each extender 46 may be electrically connected to a respective capacitive sensor element 20 to extend the active region 28 (FIG. 2) of each capacitive switch assembly 18 (FIG. 2) above the printed PCB surface 34 in instances where the printed circuit board 32 is not or cannot be mounted directly in contact with the face 48 of the enclosure 12. For example, each extender 46 may be a steel coil spring. The plastic enclosure 12 houses, seals and encapsulates the printed circuit board 32 and extenders 46. For example, the enclosure 12 may be clear plastic having a thickness in the range of about 1.5 mm to 6.35 mm thick and having a recess 50 on face 48, as shown, that is about 0.2 mm to 1.5 mm deep. As shown, layer 22 is bonded via adhesive layer 42 to the face 48 of enclosure 12 and within the recess 50, and layer 24 is bonded via adhesive layer 40 to layer 22. As shown, the layers 22, 24 are formed with conforming concave portions corresponding to each capacitive sensor assembly 18 (FIG. 2). Also shown, the adhesive layers 40, 42 are formed with holes, such as holes 52a,b corresponding to each capacitive sensor element 20. Each hole 52a,b in the adhesive layer 42 between the layer 22 and the face 48 of enclosure 12 together with the volume below the corresponding concave feature in layer 22 establishes a pocket 30 (FIG. 2) containing air or some other compressible medium.

As further shown in FIG. 4, the adhesive layers 40, 42 and layer 22 can be formed with optional passageways 54a-c to increase the amount of compressible medium, e.g. air, that is available to compress when the concave shape of the layers 22, 24 are deformed, making it easier to press the button 14. For example, the adhesive layers 40, 42 may have a thickness in the range of about 0.1 mm to 0.762 mm the layer 22 may have a thickness in the range of about 0.1 mm to 0.3 mm and the layer 24 may have a thickness in the range of about 0.4 mm to 0.6 mm. In some configurations, the layer 22 and adhesive layers 40, 42 may be replaced with a single adhesive layer containing holes (not shown). The optional passageways 54a-c provided in the layer 22 and/or adhesive layer(s) 40, 42, may extend, as shown, to adjacent holes, to provide a greater pocket volume for each button 14. This extra volume acts to decrease the systems resistance to button pressing (i.e. to make the buttons easier to press). Buttons 14 in layer 24 may be concave, as shown, or may be another shape such as flat. Thus, the layer 24 may be flat (not shown) or embossed with raised portions corresponding to each capacitive sensor element 20, as shown.

FIGS. 5 and 6 show another embodiment of a capacitive sensor assembly 18' that can be used in the controller 10 shown in FIG. 1. With initial reference to FIG. 5, it can be seen that the capacitive sensor assembly 18' includes a sensor element 20' and flexible layers 22', 24'. As shown, the sensor element 20' generates an electric field (field lines 56 illustrated by dashed lines) having an active region 28'. Also shown, the flexible layers 22', 24' are positioned to overlay the sensor element 20' and surround the active region 28'. With this arrangement, a pocket 30' is established between the flexible layer 22' and sensor element 20'. This pocket 30', in turn, can include a compressible medium, such as air, to allow the flexible layers 22', 24' over the sensor element 20' to be depressed by a user to turn a device (not shown) On or Off, such as a pump or heater.

As further shown in FIG. 5, the capacitive sensor element 20' can be formed as part of a printed circuit board 32' and can be charged by a power source (not shown) to establish the electric field 56, the strength of which dissipates with distance from the sensor element 20'. For example, as shown, the capacitive sensor element 20' may include an electrode formed in or on the surface 34' of the printed circuit board 32'. The electrode can then be electrically connected via a copper trace (not shown) in the circuit board 32' to an electronic control circuit (not shown) that is configured to output voltages corresponding to a switch state such as an 'open' switch state and a 'closed' switch state for the capacitive sensor assembly 18'. The output voltages may then be used to activate/deactivate devices (not shown) such as pumps, heaters, etc.

For the embodiment shown in FIGS. 5 and 6, layer 22' is conductive. Although for clarity purposes the discussion here will describe a conductive layer 22', those skilled in the pertinent art will appreciated that either layer 22' or layer 24' can be conductive, or alternatively, both layers 22', 24' can be conductive. For the capacitive sensor assembly 18', the conductive flexible layer 22' is capacitively coupled to a ground pad 58. More specifically, as shown, the circuit board 34' can include a first circuit board side 60 and an opposed second circuit board side 62, with the sensor element 20' formed on the first circuit board side 60 and the ground pad 58 overlying, and in some implementations contacting, at least a portion of the second circuit board side 62. With the arrangement shown in FIG. 5, a first capacitor will be established between the sensor element 20' and conductive flexible layer 22' (illustrated by electric field lines 56) and a second capacitor will be established between the conductive flexible layer 22' and ground pad 58 (illustrated by electric field lines 64). Typically, as shown, to avoid a nuisance capacitance between the ground pad 58 and sensor element 20', the location 66 on the second circuit board side 62 that is diametrically opposite the sensor element 20' is not covered by the ground pad 58.

With the arrangement shown, each capacitive sensor element 20' is in series with the conductive layer 22'. The conductive layer 22' acts as a capacitor by taking on the charge of the fringe of the electric fields 56 of all the capacitive sensor elements 20' in the controller 10 (FIG. 1), thereby shielding them from outside interference and making the conductive layer 22' act as a positive conductive plate in relation to the ground pad 58 on the circuit board 32' and creating the electric field shown by field lines 64 between the layer 22' and ground pad 58 which closes the circuit for each switch.

When the button 14' is pressed as shown in FIG. 6 by pushing its corresponding embossed area (i.e. concave portion) of layers 22', 24' down, and as long as the conductive layer 22' is of a low enough resistance, this action displaces the empty space in pocket 30' (FIG. 5). As this happens, the conductive layer 22' is exposed to more of the electric field (as illustrated by field lines 56' from sensor element 20 in FIG. 6), the conductive layer 22' takes an increased charge from the electric field, changing the capacitance between the sensor element 20' and conductive layer 22'. This change in capacitance is then registered as a button press. In more mathematical terms, for the construction shown in FIGS. 5 and 6, if the capacitance between sensor element 20' and the conductive layer 22' is $C_s$, and the capacitance of the field between the ground pad 58 and conductive layer 22' is $C_g$, then the total capacitance ($C_x$) can be calculated by:

$$C_x = \frac{C_s * C_g}{C_s + C_g}$$

In more structural terms, the controller 10 (FIG. 1) can include a control circuit (not shown), for example having a processor or other electronic logic elements, that is responsive to the total capacitance ($C_x$). Depending on this total capacitance, the control circuit generates an output signal that corresponds to a particular switch state for a connected device (not shown), such as a pump or heater. Typically, the output of the control circuit is a signal having a voltage within a first voltage range for a first switch state and a signal having a voltage within a second voltage range for a second switch state. For the controller 10 (FIG. 1), the control circuit is designed and/or calibrated to change a switch state output when the flexible layer 22' is deformed and to maintain a current switch state output in response to the presence of water or other contaminants on the external surface 38' of layer 24'.

FIG. 5 further shows that the layer 24' may be bonded via adhesive layer 40' to layer 22' which is in turn bonded via adhesive layer 42' to an external surface of the control enclosure 12', which is typically made of clear plastic, to surround the active region 28' of the capacitive sensor element 20'. The capacitive sensor element 20' and printed circuit board 32' may be disposed within the enclosure 12', as best appreciated by cross referencing FIGS. 1 and 5. With this arrangement, water droplets from splashing or condensation are unable to inadvertently enter the active region 28' of the capacitive sensor assembly 18' and register a false positive. For the embodiment shown in FIGS. 5 and 6, the layers 22', 24' may be shaped to present a concave surface 38' to the user. With this concave shape, water droplets may roll off of the layer 24' to prevent water from accumulating to a size sufficient to trigger a false positive. The layer 24' may be made of a flexible plastic material such as Lexan which is a trademarked brand of polycarbonate thermoplastic available from SABIC Innovative Plastics' (formerly General Electric Plastics). Labeling may be provided on the flexible plastic material to indicate sensor function as shown in FIG. 1. In some cases, a single layer of conductive material (embodiment not shown) may be used in place of the layer 22', 24' combination. The sensor element 20' and control circuit may be designed and/or calibrated such that objects such as water droplets outside the layer 24' do not inadvertently trigger the capacitive sensor switch assembly 18'.

FIG. 6 shows the sensor switch assembly 18' after the sensor button 14' has been pressed by finger 36'. As shown, the layers 22', 24' deform to change the capacitance between the sensor element 20' and conductive layer 22' as described above. The change in capacitance (or total capacitance $C_x$ as described above) can be registered by the electronic control circuit, which in turn changes the sensor switch state and corresponding output voltage. Upon removal of the finger 36', the assembly 18' returns to the configuration shown in FIG. 5.

Figure 7:
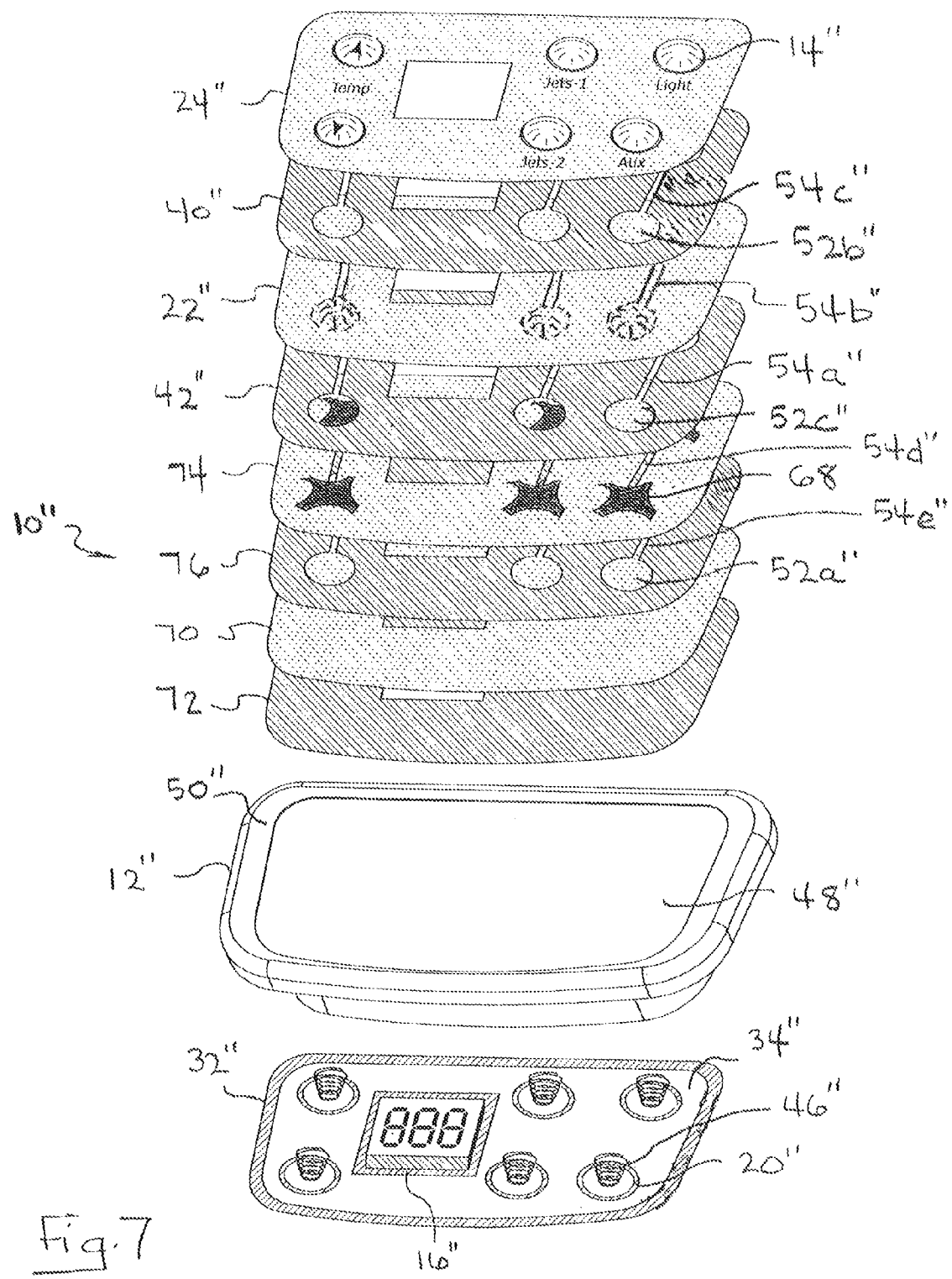
FIG. 7 is an exploded view of a controller having the capacitive sensor assemblies shown in the FIG. 5 embodiment.

FIG. 7 shows another embodiment having a conductive layer 22" (as described above with reference to FIGS. 5 and 6) but also including a layer having a plurality of tactile metal domes 68. In the case where the conductive layer 22" is not of low enough resistance, additional conductive material can be added. For example, FIG. 7 shows that tactile metal domes 68 (commonly used in membrane switch keypads) can be added under the embossed areas of layers 22", 24" that are located over the capacitive sensor elements 20", to lower resistance enough that the sensor element's field can be measurably changed (as long as the added material is in direct contact with the conductive layer 22"). Although FIG. 7 illustrates the case where the metal domes 68 electrically contact the conductive layer 22", this contact is not always necessary. For example, in the case of tactile metal domes 68 used in conjunction with a thin carbon conductive layer 22", it may be beneficial to encase the carbon layer 22' separately to protect its integrity over time. Such a modification can be made, and merely adds another capacitor in series with the capacitive sensor, the value of which can then be accounted for when detecting user input. In the example of adding tactile domes 68 over the sensor elements 20" that are not in direct contact with the conductive layer 22"—creating an electric field between the dome 68 and conductive layer 22" with capacitance, $C_d$, the total capacitance ($C_x$) would then be calculated by:

$$C_x = \frac{\frac{C_s * C_d}{C_s + C_d} * C_g}{\frac{C_s * C_d}{C_s + C_d} + C_g}$$

An exemplary embodiment of the controller 10" shown in FIG. 7 typically includes a multilayer circuit board 32" with capacitive sensor elements 20", other electronic components and a processor on the top circuit board layer, and a bottom layer comprised of a ground pad (such as ground pad 58 shown in FIG. 5) which covers all or most of the area of the bottom layer of the circuit board 32". This circuit board 32" is typically mounted inside a sealed enclosure 12" (made of clear plastic) to protect it from the harsh/wet environment. An external multi-layer graphic overlay (comprised of a plastic layer 24", conductive layer 22", and adhesive layers 40", 42") is affixed to the outside of the enclosure 12", over the area the circuit board 32".

In more detail, FIG. 7 shows an exploded view of an embodiment of a controller 10" having a printed circuit board 32" (PCB) having an LED or LCD readout 16", a plurality of capacitive sensor elements 20", each electrically connected a respective extender 46" to extend the active region 28" (FIG. 5) of each capacitive switch assembly 18' (FIG. 5) above the printed PCB surface 34" in instances where the printed circuit board 32" is not or cannot be mounted directly in contact with the face 48" of the enclosure 12". For example, each extender 46" may be a steel coil spring. The plastic enclosure 12" houses, seals and encapsulates the printed circuit board 32" and extenders 46". For example, the enclosure 12" may be clear plastic having a thickness in the range of about 1.5 mm to 6.35 mm thick and having a recess 50" on face 48", as shown, that is about 0.2 mm to 1.5 mm deep. As shown, a plastic bottom layer 70 is bonded via adhesive layer 72 to the face 48" of enclosure 12" and within the recess 50". Layer 74 having tactile metal domes 68 is bonded via adhesive layer 76 to layer 70, as shown. As shown, the layers 22", 24" are formed with conforming concave portions corresponding to each capacitive sensor assembly 18' (FIG. 5). It can further be seen that conductive layer 22" is bonded via adhesive layer 42" to layer 74 and layer 24" is bonded via adhesive layer 40" to layer 22". Also shown, the adhesive layers 40", 42", 76 are formed with holes, such as holes 52a",b",c" corresponding to each capacitive sensor element 20". Holes 52b",c" in the adhesive layers 40", 42" allow for contact between the domes 68, layer 22" and layer 24" over a respective sensor element 20". Hole 62a" in the adhesive layer 76 together with the volume under dome 68 establishes a pocket (similar to pocket 30' shown in FIG. 5) containing air or some other compressible medium.

As further shown in FIG. 7, the layers 40", 22", 42", 74 and 76 can be formed with optional passageways 54a"-54e" to increase the amount of compressible medium, e.g. air, that is available to compress when the concave shape of the layers 22", 24" are deformed, making it easier to press the button 14". For example, the adhesive layers 40", 42", 76 may have a thickness in the range of about 0.1 mm to 0.762 mm and the layer 22" may have a thickness in the range of about 0.1 mm to 0.3 mm and the layer 24" may have a thickness in the range of about 0.4 mm to 0.6 mm. In some configurations, the layer 22" and adhesive layers 40", 42" may be replaced with a single adhesive layer containing holes (not shown). The optional passageways 54a"-54e" may extend, as shown, to adjacent holes, to provide a greater pocket volume for each button 14". This extra volume acts to decrease the system's resistance to button pressing (i.e. to make the buttons easier to press). Buttons 14" in layer 24" may be concave, as shown, or may be another shape such as flat. Thus, the layer 24" may be flat (not shown) or embossed with raised portions corresponding to each capacitive sensor element 20", as shown.

While the particular capacitive touch sensor assembly for use in a wet environment as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A controller for use in a wet environment comprising:
 a ground pad;
 a sensor element generating an electric field having an active region;
 a flexible layer having a conductive portion overlaying the sensor element to surround the active region with the conductive portion capacitively coupled to the ground pad without direct conductive contact between the ground pad and conductive portion; and
 a control circuit responsive to a capacitance between the sensor element and the conductive portion to generate an output corresponding to a switch state.

2. A controller as recited in claim 1 wherein a pocket is established between the conductive portion and the sensor and the pocket contains a compressible medium.

3. A controller as recited in claim 2 wherein said pocket is a first pocket in fluid communication with a passageway and the passageway is in fluid communication with a second pocket to increase the volume of compressible medium compressed during a deformation of the flexible layer.

4. A controller as recited in claim 1 further comprising an enclosure having an enclosure wall and wherein said conductive portion is positioned on an external surface of the enclosure on a first side of the enclosure wall and the ground pad is disposed within the enclosure on a second side of the enclosure wall, opposite the first side of the enclosure wall with the conductive portion capacitively coupled with the ground pad through the enclosure wall.

5. A controller as recited in claim 1 wherein the control circuit comprises a printed circuit board having a first circuit board side and an opposed second circuit board side, with the sensor element formed on the first circuit board side and with the ground pad overlying at least a portion of the second circuit board side.

6. A controller as recited in claim 1 wherein the control circuit is calibrated to change a switch state output when the conductive portion is deformed and to maintain a current switch state output in response to the presence of water on the controller.

7. A controller as recited in claim 1 wherein said conductive portion has a first side nearest said sensor element and a second side and wherein at least a portion of said second side is concave.

* * * * *